(12) United States Patent
Strickler et al.

(10) Patent No.: US 8,450,756 B2
(45) Date of Patent: May 28, 2013

(54) MULTI-DIMENSIONAL LED ARRAY SYSTEM AND ASSOCIATED METHODS AND STRUCTURES

(75) Inventors: Samuel C. Strickler, Boise, ID (US); Nickolaus W. Kaiser, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 346 days.

(21) Appl. No.: 12/815,278

(22) Filed: Jun. 14, 2010

(65) Prior Publication Data

US 2011/0303929 A1     Dec. 15, 2011

(51) Int. Cl.
 *H01L 33/48* (2010.01)
 *H01L 33/62* (2010.01)
 *H01L 33/52* (2010.01)
 *H01L 33/00* (2010.01)
 *H01L 33/64* (2010.01)

(52) U.S. Cl.
 CPC ............... *H01L 33/48* (2013.01); *H01L 33/62* (2013.01); *H01L 33/52* (2013.01); *H01L 33/00* (2013.01); *H01L 33/64* (2013.01)
 USPC .......... 257/91; 257/98; 257/99; 257/E33.056; 257/E33.061; 257/E33.066; 257/E33.067; 257/E3.075

(58) Field of Classification Search
 USPC ............... 257/91, 98, 99, E33.056, E33.061, 257/E33.066, E33.067, E33.075
 See application file for complete search history.

(56) References Cited

U.S. PATENT DOCUMENTS

| 5,420,444 | A | 5/1995 | Sawase et al. | |
|---|---|---|---|---|
| 6,250,774 | B1 * | 6/2001 | Begemann et al. | 362/231 |
| 6,452,217 | B1 | 9/2002 | Wojnarowski et al. | |
| 6,635,987 | B1 | 10/2003 | Wojnarowski et al. | |
| 7,153,000 | B2 | 12/2006 | Park et al. | |
| 7,157,839 | B2 * | 1/2007 | Ouderkirk et al. | 313/111 |
| 7,302,181 | B2 | 11/2007 | Ng et al. | |
| 7,687,813 | B2 | 3/2010 | Nakamura et al. | |
| 8,029,165 | B2 * | 10/2011 | Livesay et al. | 362/310 |
| 2005/0207152 | A1 * | 9/2005 | Maxik | 362/231 |
| 2007/0291482 | A1 | 12/2007 | Baroky et al. | |
| 2009/0127567 | A1 | 5/2009 | Wang | |
| 2009/0161040 | A1 | 6/2009 | Khan et al. | |
| 2009/0316406 | A1 | 12/2009 | Livesay et al. | |

FOREIGN PATENT DOCUMENTS

| KR | 100471705 B1 | 8/2005 |
|---|---|---|
| KR | 100754973 B1 | 9/2007 |
| KR | 100944931 B1 | 3/2010 |
| WO | 2008123711 A1 | 10/2008 |

OTHER PUBLICATIONS

International Search Report and Written Opinion issued Dec. 7, 2011 in International Application No. PCT/US2011/037220, 6 pages.

\* cited by examiner

*Primary Examiner* — David S Blum
(74) *Attorney, Agent, or Firm* — Perkins Coie LLP (57) ABSTRACT

A formed, multi-dimensional light-emitting diode (LED) array is disclosed. A substrate is bent into a trapezoidal shape having different sections facing in different directions. Each section has one or more mounted LEDs that emit light with an azimuthally non-circular, monotonic angular distribution. A converter material is placed in an optical path of the LEDs to alter characteristics of the light from the LEDs.

27 Claims, 12 Drawing Sheets

MULTI-DIMENSIONAL LED ARRAY SYSTEM AND ASSOCIATED METHODS AND STRUCTURES

TECHNICAL FIELD

The present disclosure is related to solid state lighting (SSL) devices and associated methods of operation and manufacture including light emitting diodes (LEDs) and formed, multi-dimensional structures associated with the LEDs.

BACKGROUND

LEDs are increasingly in demand for many purposes because such devices efficiently produce high-intensity, high-quality light. Mobile phones, personal digital assistants, digital cameras, MP3 players, and other portable devices use SSL devices, such as white light LEDs, for background illumination. LEDs can be used for many other applications, such as ceiling panels, desk lamps, refrigerator lights, table lamps, street lights, and automobile headlights.

Figure 1A:
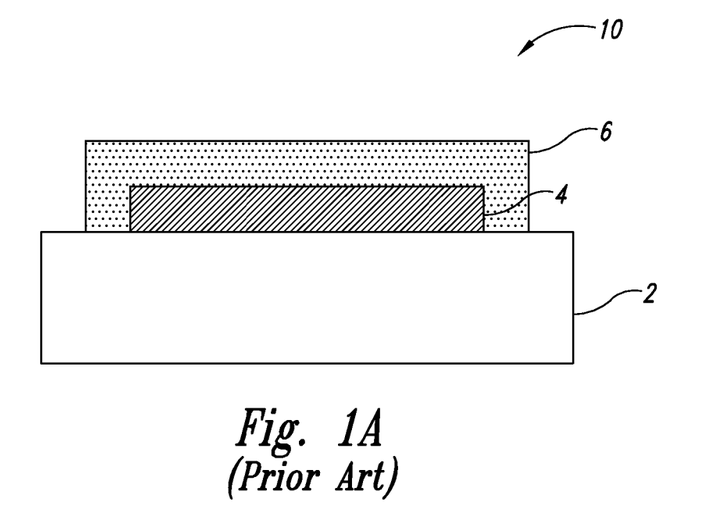
FIG. 1A is a partially schematic cross-sectional view of an LED configured in accordance with the prior art.
Figure 1B:
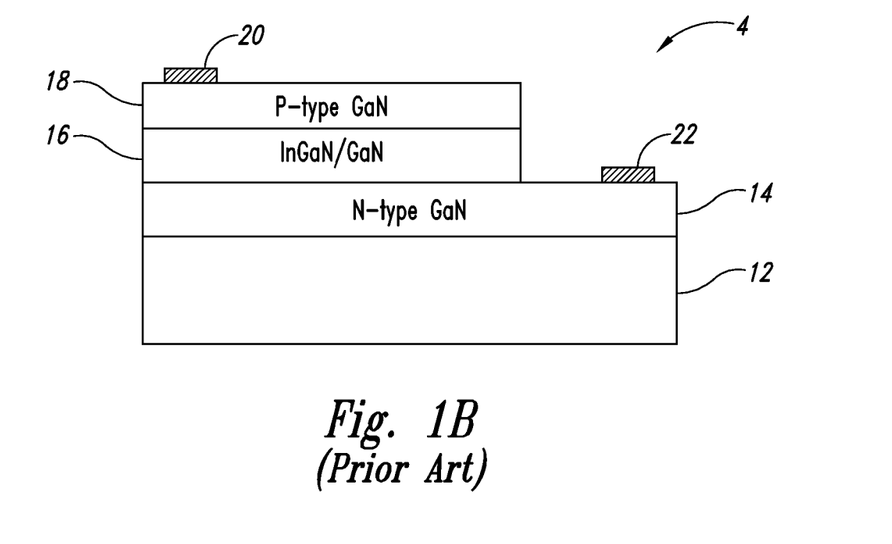
FIG. 1B is a partially schematic cross-sectional view of an LED configured in accordance with the prior art.

White light is desirable for many applications, but commonly available LEDs typically cannot directly produce white light. One conventional technique for emulating white light with LEDs includes depositing a converter material, such as a phosphor, on a light emitting material. For example, as shown in FIG. 1A, a conventional LED device 10 includes a support 2 carrying an LED die 4 and a converter material 6 deposited on the LED die 4. The LED die 4 can include one or more light emitting components. For example, as shown in FIG. 1B, the LED die 4 can include a silicon substrate 12, an N-type gallium nitride (GaN) material 14, an indium gallium nitride (InGaN) material 16 (and/or GaN multiple quantum wells), and a P-type GaN material 18 arranged in serial layers. The LED die 4 can also include a first contact 20 on the P-type GaN material 18 and a second contact 22 on the N-type GaN material 14. Referring to both FIGS. 1A and 1B, in operation, the InGaN material 16 of the LED die 4 emits a blue light that stimulates the converter material 6 to emit a light (e.g., a yellow light) at a desired frequency. The combination of the blue and yellow emissions appears white to human eyes if matched appropriately.

Figure 2A:
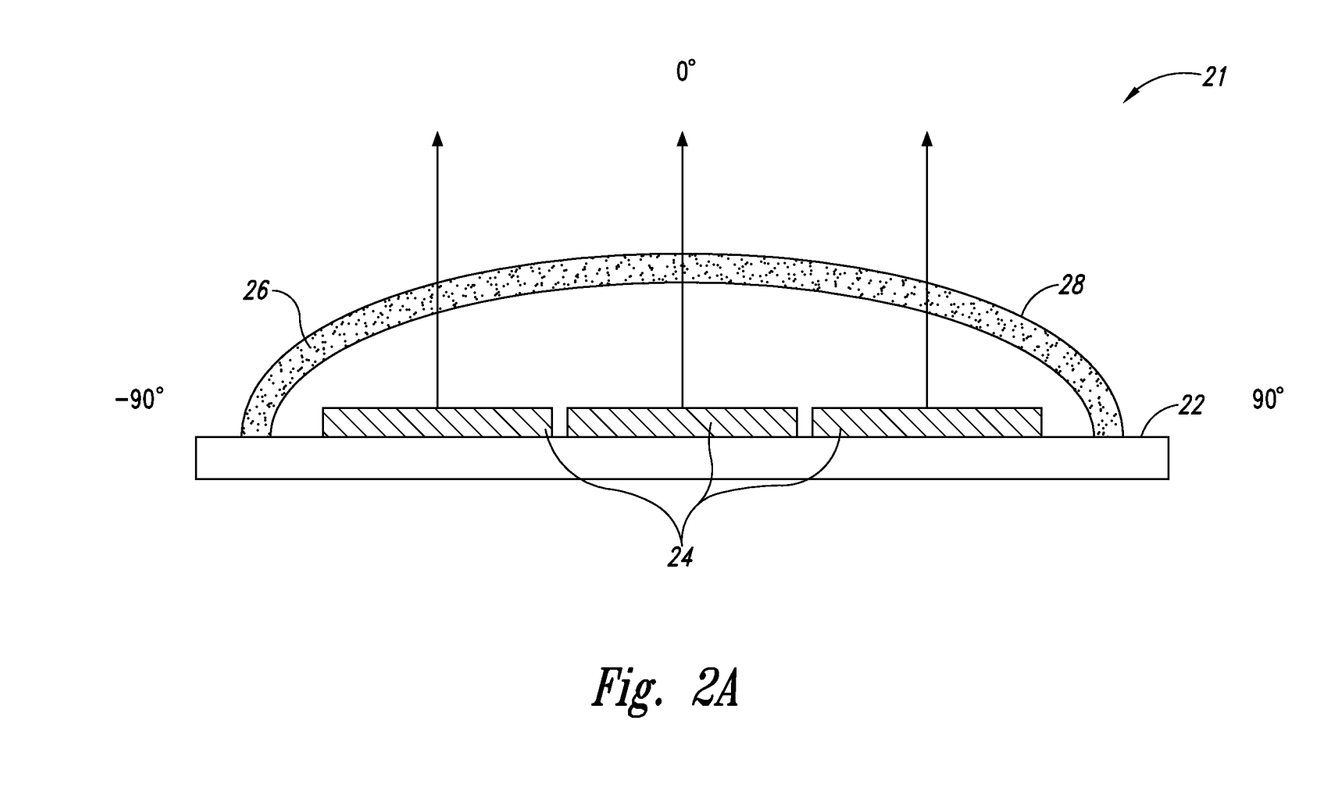
FIG. 2A is a partially schematic cross-sectional view of an LED assembly configured in accordance with the prior art.
Figure 2B:
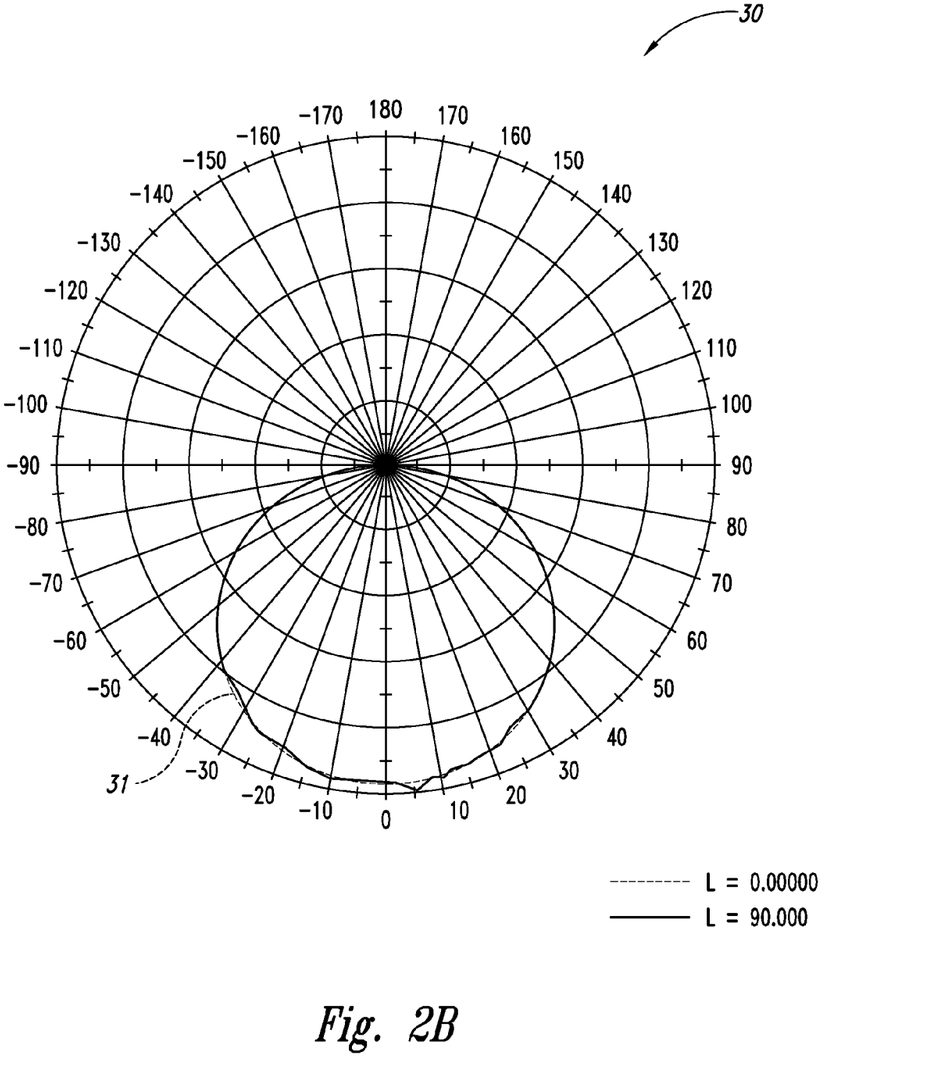
FIG. 2B shows an angular illuminance distribution from an LED configured in accordance with the prior art.

Another conventional construction of an SSL device 21 is shown in FIG. 2A. The device 21 has a generally flat surface 22 upon which LEDs 24 are mounted. The device 21 also includes a lens 28 formed over the LEDs 24. The lens 28 can include a converter material 26 within or upon the lens 28. This configuration produces light focused primarily in one direction: normal to the LEDs 24. FIG. 2B illustrates the angular distribution produced by a conventional LED device 21 shown in FIG. 2A. The illuminance level (indicated by line 31) produced by the device 21 is strongest at 0° (directly above the LEDs 24), and drops off to zero at the 90° station and the −90° station (to the left and right of the LEDs 24). This distribution is referred to as a circular distribution and is suitable for some lighting applications. However, many other applications can benefit from a more dispersed distribution of light. Accordingly, there remains a need for LED systems that produce other light distribution patterns.

DETAILED DESCRIPTION

The presently disclosed new technology described herein is directed generally to solid state lighting (SSL) devices and associated methods of operation and manufacture. Specific details of several embodiments of the new technology are described below with reference to LEDs and light converter materials including phosphor materials, and associated methods of manufacturing LED assemblies. The term "phosphor" generally refers to a material that emits light when irradiated by energized particles (e.g., electrons and/or photons). A person skilled in the relevant art will understand that the new technology may have additional embodiments and that the new technology may be practiced without several of the details of the embodiments described below with references to FIGS. 3A-7B.

Figures 3A, 3B:
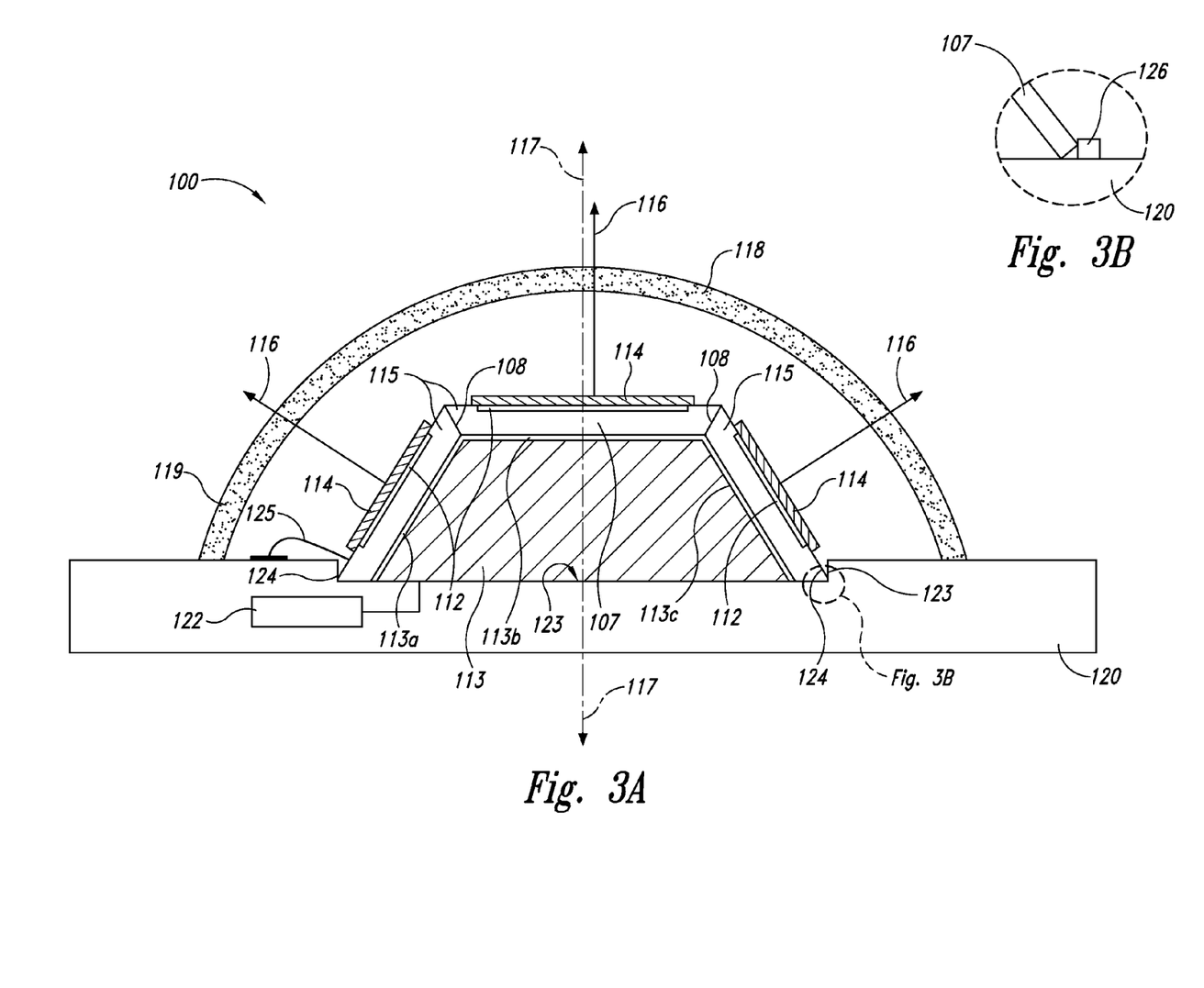
FIG. 3A depicts an LED assembly configured in accordance with an embodiment of the present disclosure.
FIG. 3B is a magnified view of another arrangement for a portion of the assembly of FIG. 3A in accordance with an embodiment of the present disclosure.

FIG. 3A illustrates an LED device assembly 100 configured in accordance with an embodiment of the present disclosure. The assembly 100 includes a substrate 107 carrying a plurality of LEDs 114, and a support 113 having several angled surfaces or facets 113a, 113b, and 113c. The substrate 107 can be bent over the support 113 and can have several generally planar segments or sections 115 with junction regions 108 between neighboring sections 115. The sections 115 can have LED attachment sites 112 to which the LEDs 114 are mounted. The junction regions 108 of the substrate 107 can be flexible by being thinner than the remainder of the substrate 107 and/or by having a composition different than the rest of the substrate 107. The substrate 107 can begin as a flat substrate, to which the LEDs 114 can be easily mounted using existing wirebonding and other flat-mounting technology. At a later stage of manufacture, the substrate 107 can be placed over the support 113 and pressed against the support 113 to generally conform to the shape of the angled surfaces 113a, 113b, and 113c. In other embodiments, the substrate 107 can be shaped apart from the support 113 and then placed onto the support 113 afterward. In still other embodiments, the substrate 107 can stand alone with no support 113 underneath.

Individual LEDs 114 can be oriented to face in a primary direction 116 that is generally perpendicular to the surface of the section 115 supporting the LED 114. Light emitted from each LED is generally centered or focused along the corresponding primary direction 116. In this depiction, the substrate 107 has three sections 115 facing three different directions; however, the substrate 107 can include any suitable number of sections 115 that can face any suitable number of directions. The varying directions 116 of the LEDs 114 can provide a more advantageously distributed light pattern (e.g., a more uniformly distributed light pattern). In contrast to conventional LED assemblies that direct light primarily in one direction, the assembly 100 of the present disclosure can deliver light more uniformly over a wider angular range.

The substrate 107 and the support 113 can be made of a thermally and/or electrically conductive material (e.g., copper, aluminum, etc.). The substrate 107 and the support 113 together can accordingly provide electrical communication to the LEDs 114 and operate as a heat sink to dissipate heat generated by the LEDs 114. The assembly 100 can further include a base 120 upon which the support 113 and substrate 107 can be placed. The base 120 can contain electrical circuitry 122 through which electrical signals can be passed to and from the LEDs 114 via the substrate 107. The base 120 can include a recess 123 having lateral surfaces 124 that maintain the substrate 107 in place. In other embodiments, the base 120 has no recess 123 and instead has raised blocks 126 (shown in FIG. 3B) that hold the substrate 107 in place on the base 120. In other embodiments, the substrate 107 (and the optional support 113) is held in place with an adhesive or other arrangements. The substrate 107 and support 113 can be surface-mounted, wirebonded (e.g., with one or more wirebonds 125), or otherwise attached to the base 120 with the support 113 electrically connected between the LEDs 114 and the base 120.

In some embodiments, the assembly 100 also includes a converter material 118 placed in an optical path of the light emitted by the LEDs 114. When light from the LEDs 114 passes through the converter material 118, it energizes the converter material 118 which then emits light of a desired color and quality. The converter material 118 can be placed anywhere in an optical path of the LEDs 114, including on or in a lens or cover 119, or separate from a lens or cover. For example, in one embodiment, the converter material 118 can include a phosphor containing cerium(III)-doped yttrium aluminum garnet (YAG) at a particular concentration for emitting a range of colors from green to yellow to red under photoluminescence. In other embodiments, the converter material 118 can include neodymium-doped YAG, neodymium-chromium double-doped YAG, erbium-doped YAG, ytterbium-doped YAG, neodymium-cerium double-doped YAG, holmium-chromium-thulium triple-doped YAG, thulium-doped YAG, chromium(IV)-doped YAG, dysprosium-doped YAG, samarium-doped YAG, terbium-doped YAG, and/or other suitable phosphor compositions. The lens can simply transmit the light from the LEDs 114 and converter material 118 or it can further focus or otherwise alter characteristics of the light.

The assembly 100 can have a major axis 117 that is generally normal to a surface of the base 120 and corresponds generally to the central direction in which light is emitted from the assembly 100. This axis 117 corresponds with the 0° position described later with reference to FIG. 3C. The LEDs 114 can be arranged with the primary direction 116 of at least one LED 114 facing in a direction that is not parallel with the major axis 117. The primary directions 116 of the LEDs 114 can accordingly diverge. In other words, the primary axes 116 do not intersect. The relative angle between the axes 116 can be small (near 0°) or large (90° or more). When the LEDs 114 are activated, the light leaves the assembly 100 with a wider angular distribution and provides a more uniform distribution of light than conventional assemblies.

Figure 3C:
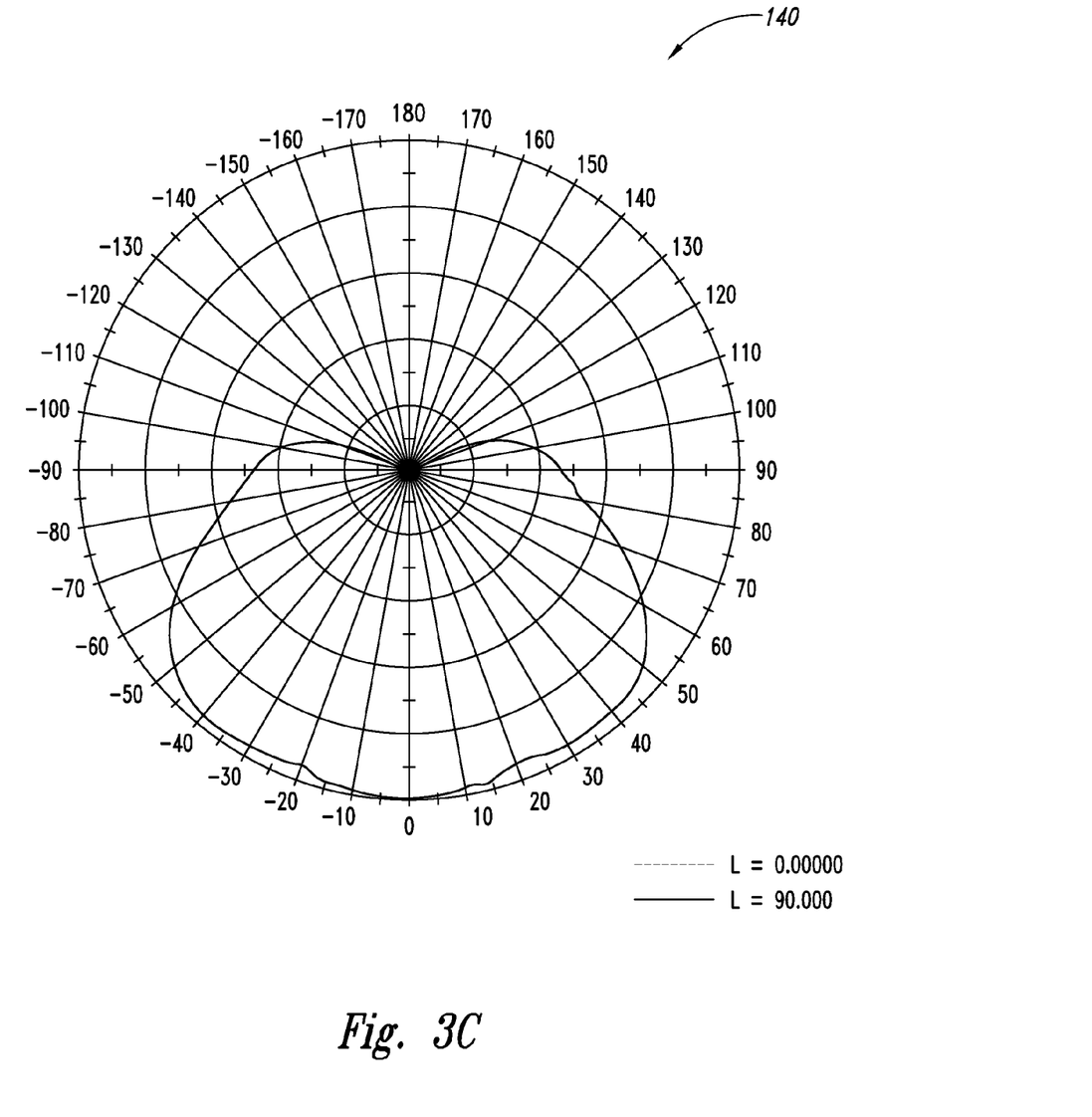
FIG. 3C is an angular illuminance distribution from an LED assembly configured in accordance with an embodiment of the present disclosure.

FIG. 3C shows an angular distribution 140 of light from the assembly 100. The angular distribution 140 can describe a non-circular, monotonically varying line between 0° and 90°, and between 0° and −90°. An advantage of this arrangement is that it distributes the light more evenly or uniformly over the range from −90° to +90°. Another advantage of the present disclosure is that with more light passing through the peripheral regions of the converter material 118 (FIG. 3A), the converter material 118 is less susceptible to fatigue or burn-out that can occur with conventional designs in which the converter material 118 directly above the LED 114 receives the most intense light.

Figure 4A:
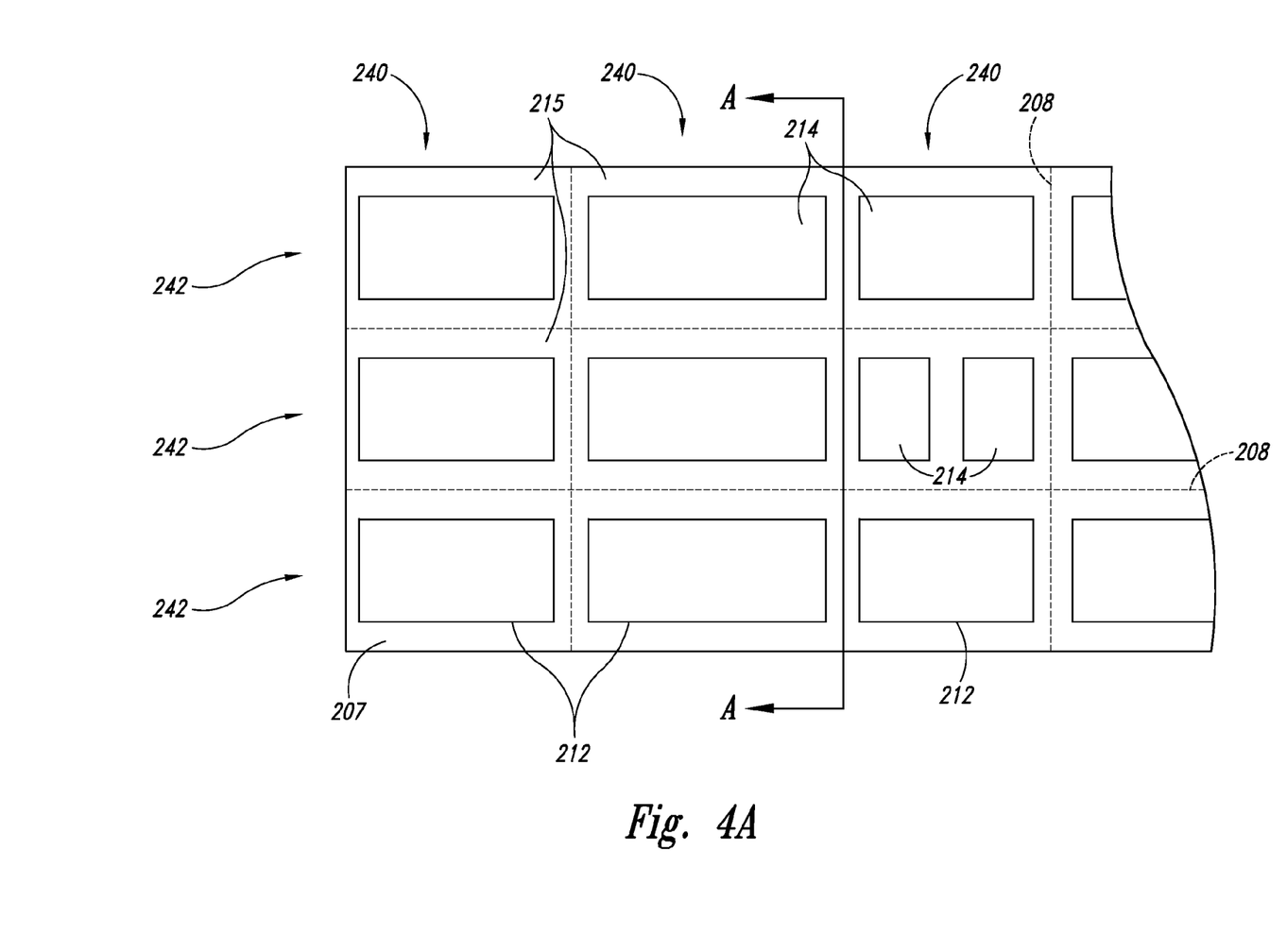
FIG. 4A is a partially schematic top view of a substrate having LED attachment sites configured in accordance with an embodiment of the present disclosure.
Figure 4B:
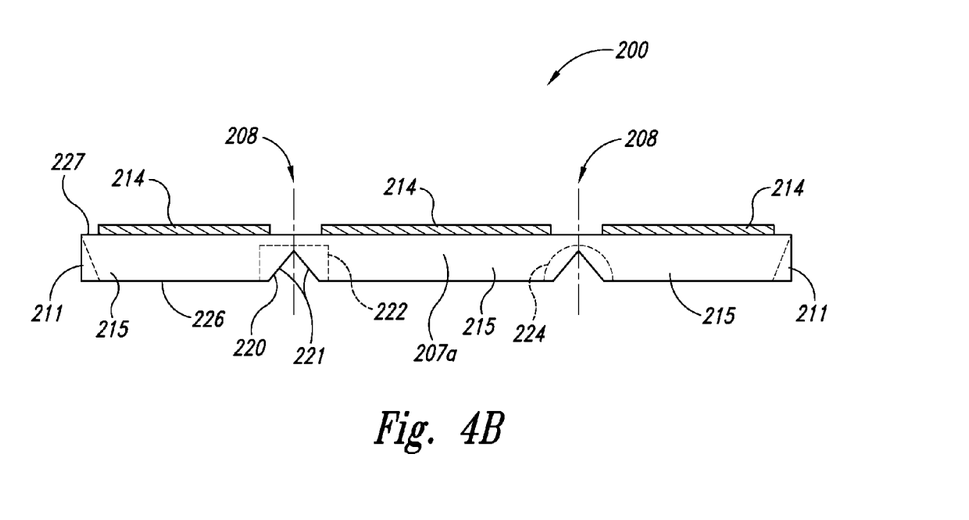
FIG. 4B is a partially schematic side cross-sectional view of a substrate scored in accordance with the present disclosure.
Figure 4C:
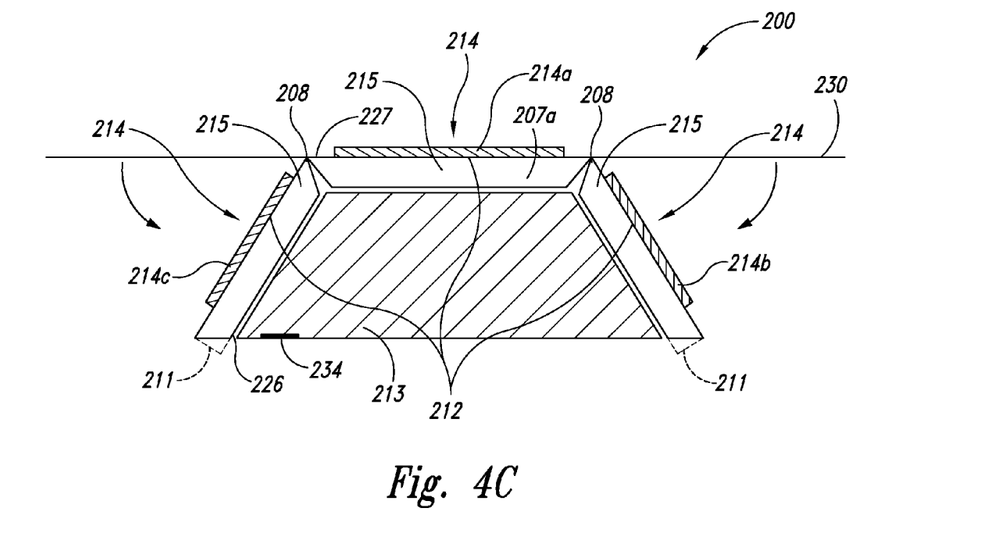
FIG. 4C is a partially schematic side cross-sectional view of a substrate bent in accordance with an embodiment of the present disclosure.

FIGS. 4A-4C illustrate a manufacturing process according to an embodiment of the present disclosure. FIG. 4A shows a top view of a substrate 207 having LEDs 214 arranged on a substrate surface at attachment sites 212. The substrate 207 has junction regions 208 between neighboring sections 215. Individual sections 215 can support one LED 214 or more than one LED (e.g., two LEDs 214 as shown at one of the sections 215a). The junction regions 208 can extend in different directions between the LEDs 214, including along the length of the substrate 207 and along the width of the substrate 207. In other embodiments, the junction regions 208 can be angled and/or curved across the substrate 207. The substrate 207 can be manufactured from a continuous strip of material that is later singulated into individual units. The LEDs 214 can then be manufactured from a wafer and singulated into individual LEDs 214 according to known methods. The LEDs 214 can be surface-mounted or wirebonded to the substrate 207. In the embodiment shown in FIG. 4A, the LEDs 214 are arranged into transverse rows 242 and columns 240 with one or more LEDs 214 between neighboring junction regions 208.

FIG. 4B is a cross-sectional view of an individual unit 200 including a singulated substrate 207a that has been cut from the substrate 207 at section A-A shown in FIG. 4A. In this embodiment, the substrate 207a has a first side 226, a second side 227 facing opposite from the first side 226, and three sections 215 separated by two corresponding junction regions 208. In an embodiment shown in FIG. 4B, the substrate 207a is made of a homogeneous material that has been scored or otherwise altered along the junction region 208. For example, the junction region 208 can be scored to create a triangular groove 220, rectangular groove 222 (shown in phantom), or circular groove 224 (also shown in phantom) at the first surface 226 of the substrate 207a. The grooves can include spaced apart, facing sidewalls 221 that facilitate bending the substrate 207a as described further below.

As shown in FIG. 4C, neighboring sections 215 of the substrate 207a can be bent at the junction regions 208, away from an initial plane 230, to form a canted or angled shape with the LEDs 214 facing in different, divergent directions. A support 213 can be formed and placed against the first surface 226 of the substrate 207a. The support 213 can be made of material similar to that of the substrate 207a, or it can be made of a different material. In some embodiments, the support 213 can be made of a thermally conductive material and can contact the substrate 207a to allow the support 213 to absorb heat from the substrate 207a. In applications that produce less heat and/or are less sensitive to heat build-up in the LEDs 214, the support 213 can be omitted, or can be made of a suitable material that does not necessarily conduct heat. In some embodiments, the support 213 can be used as an anvil or mechanical die to bend the substrate 207a into shape. In other embodiments, the substrate 207a is shaped separately from the support 213 and subsequently placed on the support 213. Ends 211 of the substrate 207a can be trimmed to seat the unit 200. The trimmed ends 211 may provide another path for electrical and/or thermal transfer to or from the LEDs 214. In some embodiments, the LEDs 214 can be attached to the substrate 207a before bending the substrate 207a. Positioning, attaching, and wiring (or surface-mounting) the LEDs 214 to the flat substrate 207a before bending can be done using known methods to quickly and inexpensively mount the LEDs 214. The LEDs 214 can also be placed onto the formed substrate 207a, but doing so may be more difficult and/or expensive due to the different orientations of the different sections 215.

The support 213 can be electrically connected to the substrate 207a which is electrically connected to the LEDs 214. Accordingly, the support 213 can contain terminals 234 for electrical signals to communicate with the LEDs 214. The electrical communication can include power and/or control signals. The support 213, the substrate 207a, and the LEDs 214 form an LED unit 200 that can be surface-mounted, wirebonded, and/or otherwise attached to other circuit elements or structures. An array of any suitable number of similar units 200 can be used to form a scalable LED assembly.

In other embodiments, any of the LEDs 214 in the LED unit 200 shown in FIG. 4 can be eliminated. For example, a central LED 214a can be omitted to achieve a more outwardly-directed light distribution. In another embodiment, one of the outer LEDs 214b and 214c can be omitted to reduce light in a particular outward direction (e.g., in an asymmetric manner). For example such an arrangement can be used along the edge of an LED panel. In other embodiments, each attachment site 212 can contain multiple LEDs 214. Accordingly, the directional light distribution can be achieved by a non-uniform distribution of LEDs 214 among different attachment sites 212 without leaving any attachment sites 212 vacant.

Figure 5A:
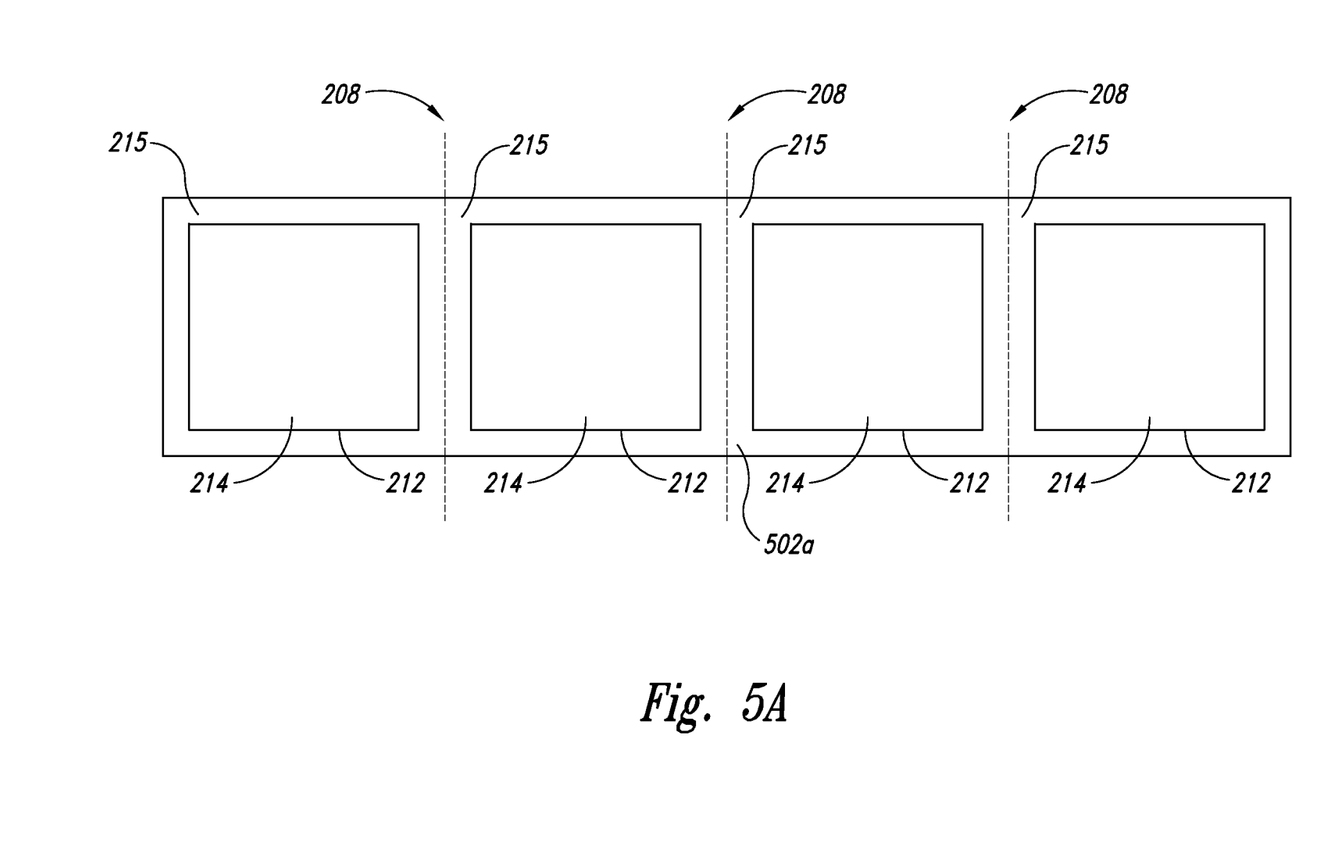
FIG. 5A is a partially schematic top view of a substrate having LED attachment sites configured in accordance with an embodiment of the present disclosure.
Figure 5B:
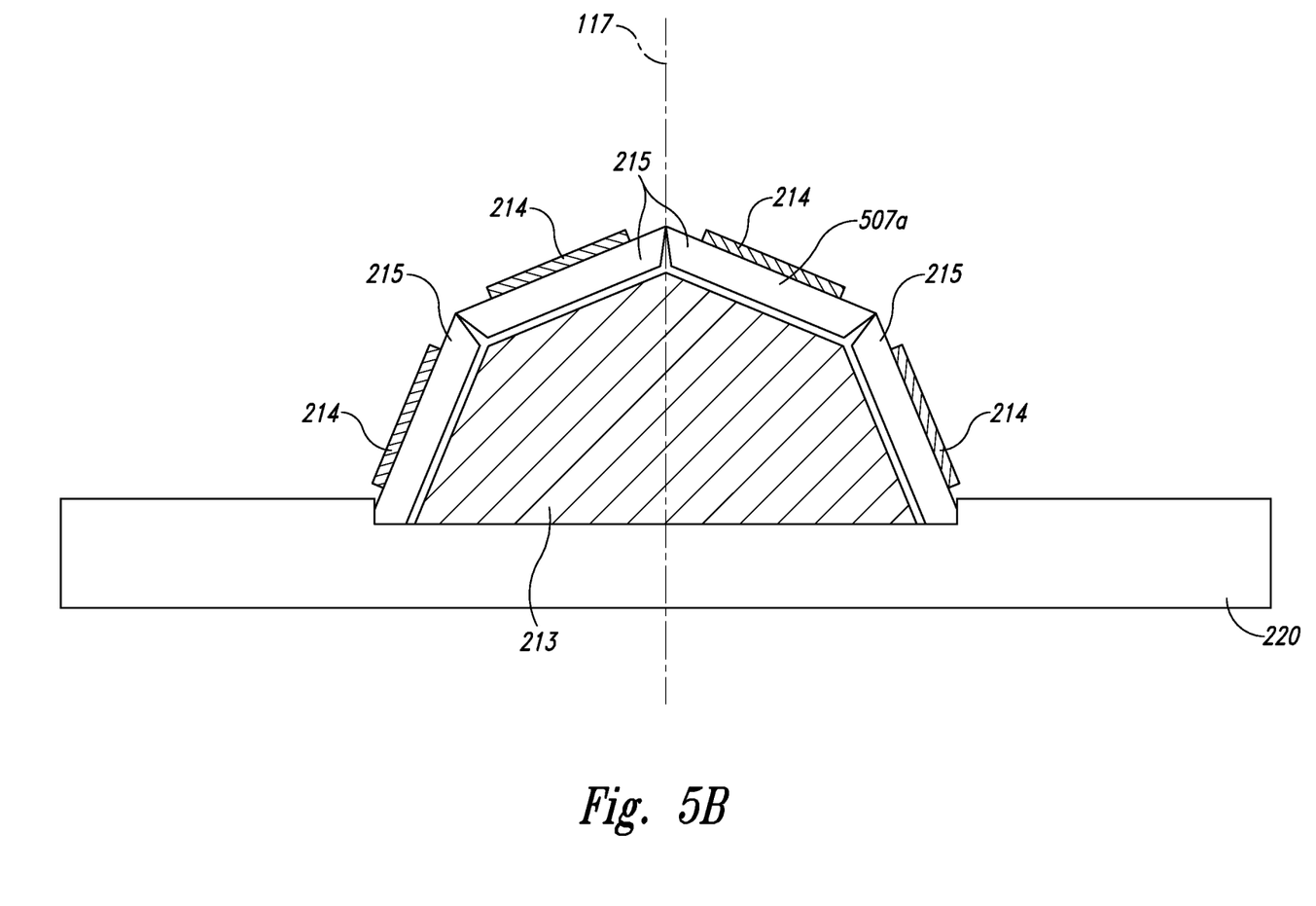
FIG. 5B is a partially schematic side view of a bent substrate for supporting an LED assembly configured in accordance with an embodiment of the present disclosure.

FIG. 5A illustrates a further embodiment of the present disclosure including a singulated substrate 507a having four sections 215 and interstitial junction regions 208 arranged in series. Other embodiments can have more or fewer sections 215. The relative size of the sections 215 can vary, and the angle between adjacent sections 215 can vary over the length of the substrate 507a. Each section 215 can include an attachment site 212 that can have one or more LEDs 214 or can be vacant. FIG. 5B shows the substrate 507a with the sections 215 bent into a convex shape to distribute light in various directions, including directions that are not parallel with the central axis 117. A support 213 can be formed with a corresponding shape to support the substrate 507a, and to conduct heat and/or electricity to and from the LEDs 214.

Figure 6:
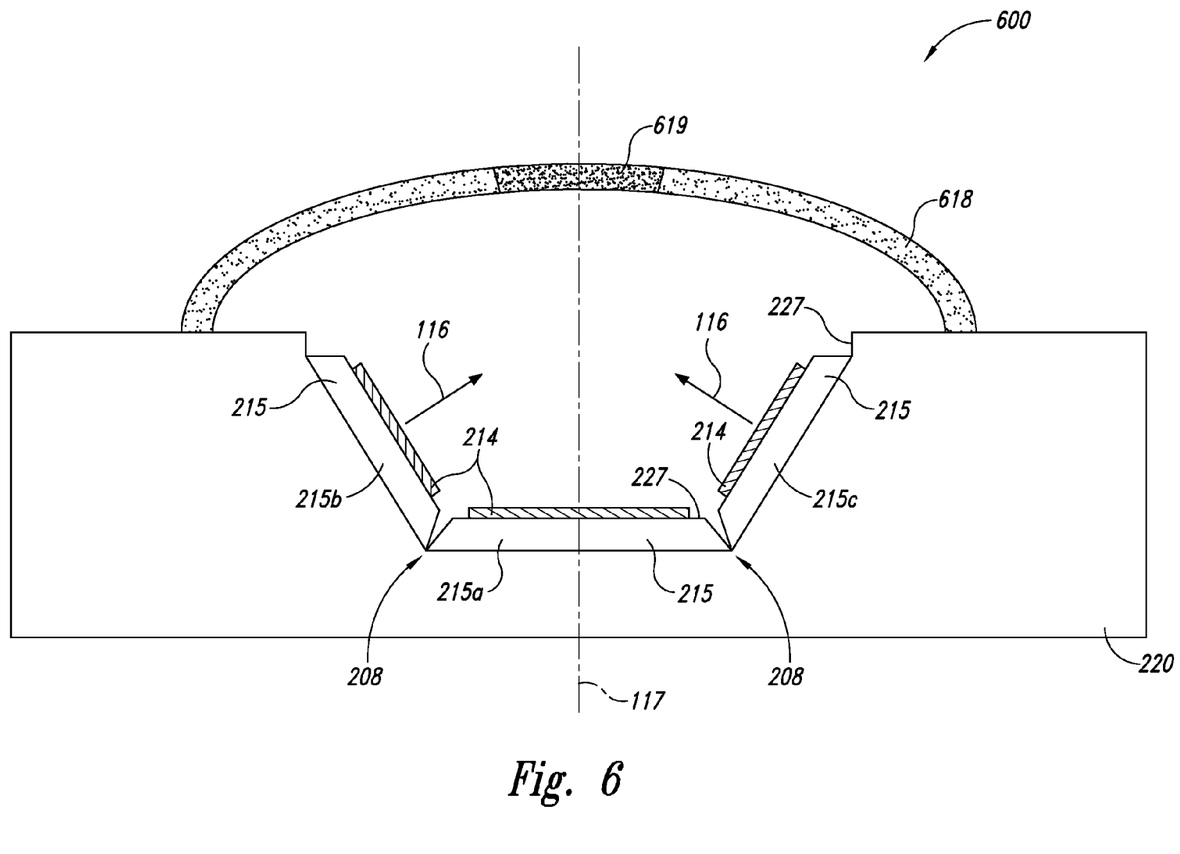
FIG. 6 is a partially schematic side view of an LED assembly with a concave shape configured in accordance with an embodiment of the present disclosure.

FIG. 6 illustrates an LED unit 600 having a substrate 607a formed with a concave surface rather than a convex surface in accordance with another embodiment of the disclosure. To create the concave surface, the substrate 607a can be bent at the junction regions 208 toward the major axis 117 so the LEDs 214 face one another, at least obliquely. In this embodiment, the primary directions 116 of the LEDs 214 converge. In a particular embodiment, the primary directions 116 are oriented toward a common focal point 619. The junction regions 208 can further include recessions or necked regions formed on the first side 227 of the substrate 607a. The junction regions 208 allow outer sections 215b, 215c to bend relative to a central section 215a. In embodiments in which the junction regions 208 include a flexible region and do not include scoring, grooves, or a recession, the same substrate 607a can be used to form either a convex or a concave configuration. In any of these embodiments at least some of these primary directions 116 can be non-parallel to the major axis 117 whether the substrate has a convex or concave shape.

The lighting unit 600 can include a converter material 618 placed in an optical path of the LEDs 214. In this embodiment, the LEDs 214 can be arranged to focus light along the primary direction 116 toward a focal point 619 which may coincide with the converter material 618. As described further below, this orientation can take advantage of a typical outcome common to many converter material and lens manufacturing processes. In particular, lenses for an LED assemblies are frequently formed by molding transparent material in a bowl shape. When a converter material is introduced into the lens in a powder or other fluid or flowable form it tends to settle toward the center of the bowl. In many applications this is considered a detrimental characteristic; however, in the implementation shown in FIG. 6, this distribution concentrates the converter material 618.

Figure 7A:
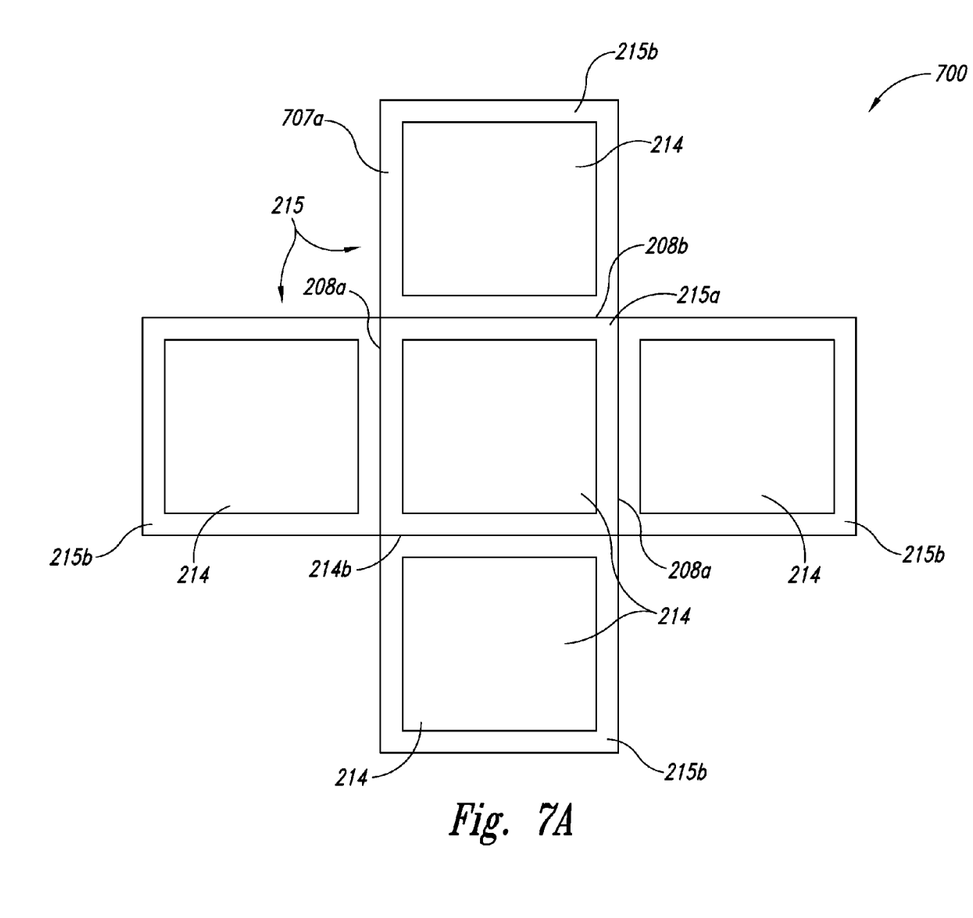
FIG. 7A is a partially schematic top view of a substrate having orthogonal sections for an LED assembly configured in accordance with an embodiment of the present disclosure.
Figure 7B:
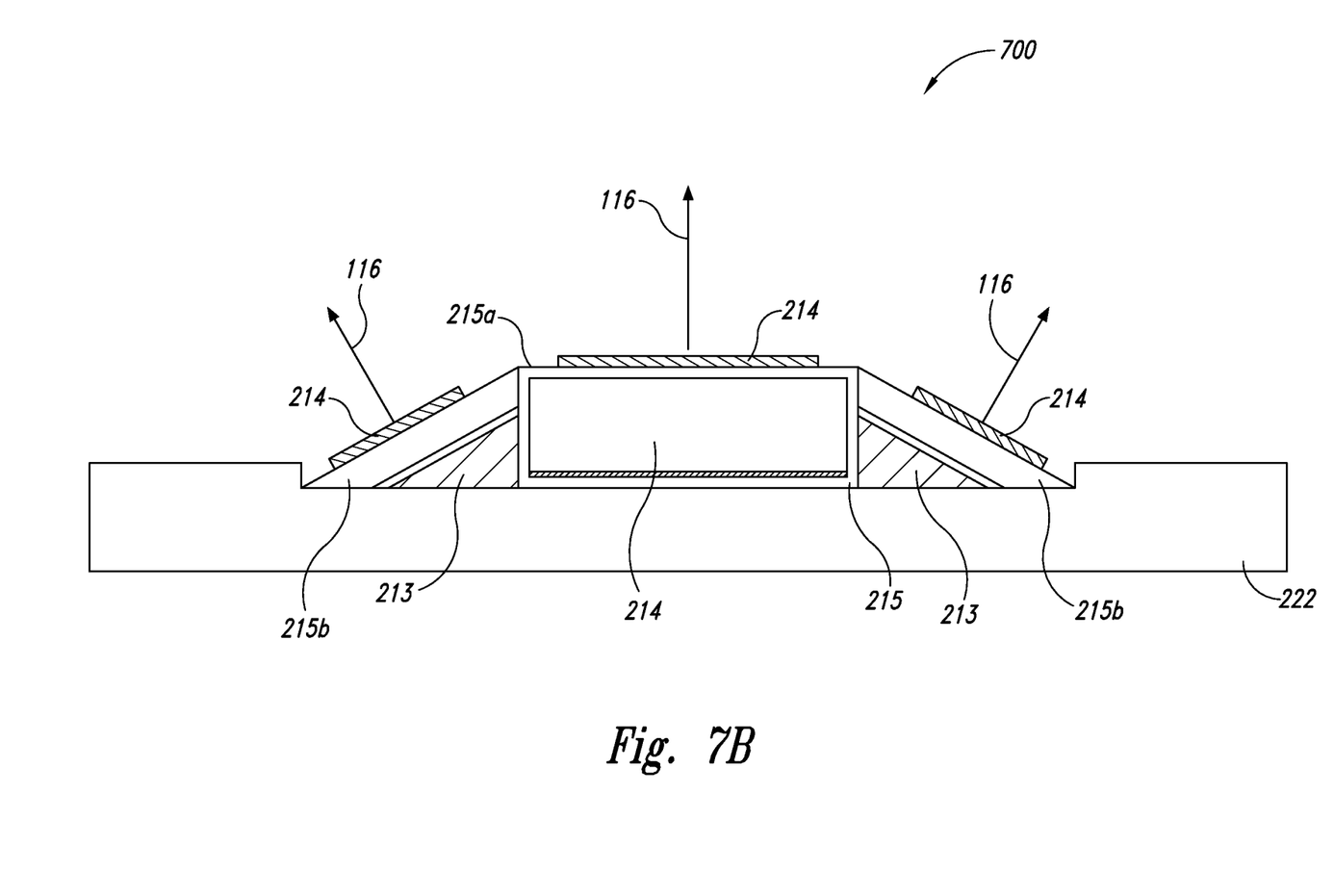
FIG. 7B is a partially schematic side view of a substrate having orthogonal sections for an LED assembly configured in accordance with an embodiment of the present disclosure.

FIGS. 7A and 7B show a top view and side view, respectively, of a lighting unit 700 configured in accordance with further embodiments of the present disclosure and having a substrate 707a with five connected sections 215 carrying LEDs 214. The sections 215 can include a rectangular central section 215a with four outer sections 215b extending away from each edge of the central section 215a. Other embodiments can include a differently shaped central section 215a having five, six or more edges, each of which can abut an outer section 215b. In an embodiment shown in FIG. 7A, the central section 215a can be square with pairs of generally parallel junction regions 208a, 208b on opposing sides of the central section 215a. Accordingly, the substrate 707a and the lighting unit 700 can have an overall cross-shape. FIG. 7B is a side view of the lighting unit 700 in which the outer sections 215b are angled relative to the central section 215a to distribute light from the LEDs 214 laterally in multiple directions as well as directly above the lighting unit 700. The substrate 707a can have a convex surface covered by the LEDs 214. The surface is discontinuously-convex because, while each section 215 has a generally flat surface, the composite surface is convex. In the embodiments in which the LEDs 214 are angled away from one another (e.g., divergent) on a convex surface, the structure of the lighting unit 700 generates a non-circular, monotonic angular light distribution similar to that depicted in FIG. 3C. In other embodiments, the lighting unit 700 can include a central section 215a and several outer sections 215 that are angled toward one another (e.g., convergent) similar to the LED unit 300 shown in FIG. 6.

From the foregoing, it will be appreciated that specific embodiments of the invention have been described herein for purposes of illustration, but well-known structures and functions have not been shown or described in detail to avoid unnecessarily obscuring the description of the embodiments of the invention. Where the context permits, singular or plural terms may also include the plural or singular term, respectively. Unless the word "or" is associated with an express clause indicating that the word should be limited to mean only a single item exclusive from the other items in reference to a list of two or more items, then the use of "or" in such a list shall be interpreted as including (a) any single item in the list, (b) all of the items in the list, or (c) any combination of the items in the list.

Also, it will be appreciated that specific embodiments described above are for purposes of illustration and that various modifications may be made without deviating from the invention. Aspects of the disclosure described in the context of particular embodiments may be combined or eliminated in other embodiments. For example, certain aspects of the disclosure discussed in the context of divergent configurations (e.g., the LEDs are placed on a convex surface) can also be applied to convergent configurations. While certain features have been described herein as being "outer" relative to other features, these features may or may not be "outermost" depending on different applications. Further, while advantages (e.g., angular light distribution advantages) associated with certain embodiments of the disclosure may have been described in the context of those embodiments, other embodiments may also exhibit such advantages, and not all embodiments need necessarily exhibit such advantages to fall within the scope of the disclosure. For example, the angle between neighboring substrate sections can vary greatly, which can affect the distribution of light without departing from the present disclosure. Accordingly, the present disclosure and associated technology can encompass other embodiments not expressly shown or described herein.

We claim:

1. A light-emitting diode (LED) system, comprising:
   a substrate having a first side, a second side facing away from the first side, a first section, a second section, and a recessed score line on the first side between the first section and the second section, wherein the first section is bent relative to the second section about the score line with an angle between the first section and the second section on the first side of the substrate being less than 180 degrees, wherein the score line defines a first surface and a second surface in the substrate, and wherein the first surface faces in a first direction and the second surface faces in a second direction that converges with the first direction;
   a first LED carried by the first section; and
   a second LED carried by the second section.

2. The LED system of claim 1 wherein the LEDs are mounted to the first side of the substrate.

3. The LED system of claim 1 wherein the LEDs are mounted to the second side of the substrate.

4. The LED system of claim 1 wherein the first LED is positioned to emit light in a first primary direction and the second LED is positioned to emit light in a second primary direction, and wherein the first and second primary directions converge.

5. The LED system of claim 1 wherein the first LED is positioned to emit light in a first primary direction and the second LED is positioned to emit light in a second primary direction, and wherein the first and second primary directions diverge.

6. The LED system of claim 1 wherein the score line is a first score line, and wherein the substrate further comprises a third section adjacent to the second section with a second score line on the first side of the substrate between the second section and the third section.

7. The LED system of claim 6 wherein the first score line and the second score line are generally parallel.

8. The LED system of claim 1 wherein the first section is a central section and has four edges, and wherein the substrate further comprises a third section, a fourth section, and a fifth section, and further wherein each of the second, third, fourth, and fifth sections are connected to a corresponding one of the four edges of the central section, with a score line at each of the four edges.

9. The LED system of claim 8 wherein neighboring edges of the central section are oriented approximately 90 degrees from one another.

10. The LED system of claim 1 wherein each section carries a plurality of LEDs.

11. The LED system of claim 1 wherein the first LED is positioned to emit light along a first optical path and the second LED is positioned to emit light along a second optical path, and wherein the system further comprises a first portion of converter material in the first optical path and a second portion of converter material in the second optical path.

12. The LED system of claim 1, further comprising a lens positioned along an optical path of at least one of the LEDs.

13. The LED system of claim 11 wherein the converter material comprises a phosphor material containing at least one of cerium(III)-doped yttrium aluminum garnet (YAG), neodymium-doped YAG, neodymium-chromium double-doped YAG, erbium-doped YAG, ytterbium-doped YAG, neodymium-cerium double-doped YAG, holmium-chromium-thulium triple-doped YAG, thulium-doped YAG, chromium(IV)-doped YAG, dysprosium-doped YAG, samarium-doped YAG, or terbium-doped YAG.

14. The LED system of claim 1 wherein the scribe line includes a linear recess with a V-shaped cross-section.

15. The LED system of claim 1, further comprising a support having a backside, a first face, and a second face, wherein the first face is in contact with the first section and the second face is in contact with the second section.

16. The LED system of claim 1 wherein the substrate is formed from a homogeneous material.

17. A light-emitting diode (LED) apparatus, comprising:
    a substrate having a first side, a second side facing away from the first side, a central section, a first outer section, and a second outer section, wherein the first and second outer sections are adjacent to and on opposite sides of the central section, the substrate further having a first score line between the central section and the first outer section, and a second score line between the central section and the second outer section, wherein the score lines are on the first side of the substrate, and the substrate is bent about the first and second score lines to form a discontinuously-convex shape at the second side of the substrate;
    a central LED carried by the central section, a first LED carried by the first outer section, and a second LED carried by the second outer section, wherein the central LED, the first LED, and the second LED are carried on the second side of the substrate; and
    a support contacting the first side of the substrate, the support having a central facet contacting the first side of the substrate at the central section, a first facet contacting the first side of the substrate at the first outer section, and a second facet contacting the first side of the substrate at the second outer section.

18. The LED apparatus of claim 17 wherein the central section, the first outer section, and the second outer section have generally similar dimensions, and wherein the first and second outer sections are canted relative to the central section about the score lines at generally the same angle.

19. The LED apparatus of claim 17 wherein the substrate further comprises a third outer section and a fourth outer section adjacent to the central section, with a third score line between the central section and the third outer section and a fourth score line between the central section and the fourth outer section.

20. The LED apparatus of claim 19 wherein the support has a third face contacting the third outer section and a fourth face contacting the fourth outer section.

21. The LED apparatus of claim 17 wherein the support is electrically and thermally conductive.

22. The LED apparatus of claim 17 wherein the LEDs are connected to the substrate through at least one of a surface mount and a wirebond.

23. The LED apparatus of claim 17 wherein the LED apparatus is part of an array of similar LED apparatuses in an LED array, and wherein the sections are angled toward an edge of the LED array to direct light outwardly from the LED array.

24. The LED apparatus of claim 17 wherein the LED apparatus is part of an array of similar LED apparatuses in an LED array, and wherein the sections are angled away from an edge of the LED array to direct light inwardly toward a center of the LED array.

25. The LED apparatus of claim 17, further comprising a base that carries the support and the substrate, wherein the base holds the first section of the substrate between the base and the support, and wherein the base holds the second section of the substrate between the base and the support.

26. The LED apparatus of claim 25 wherein the base includes a recess that holds the first and second sections of the substrate in place.

27. The LED apparatus of claim 25 wherein the base includes a raised block element that holds the first and second sections of the substrate in place.

* * * * *